United States Patent
Furumiya et al.

(10) Patent No.: US 6,879,234 B2
(45) Date of Patent: Apr. 12, 2005

(54) SEMICONDUCTOR INTEGRATED CIRCUIT

(75) Inventors: Masayuki Furumiya, Kanagawa (JP); Ryota Yamamoto, Kanagawa (JP); Jun Kishi, Kanagawa (JP); Hiroaki Ohkubo, Kanagawa (JP); Yasutaka Nakashiba, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 260 days.

(21) Appl. No.: 10/352,048

(22) Filed: Jan. 28, 2003

(65) Prior Publication Data

US 2003/0146816 A1 Aug. 7, 2003

(30) Foreign Application Priority Data

Feb. 1, 2002 (JP) .......................................... 2002-026068

(51) Int. Cl.[7] .......................... H01F 5/00; H01F 27/28; H01L 27/08
(52) U.S. Cl. ................. 336/200; 336/232; 257/E27.046
(58) Field of Search ....................... 336/200, 222–224, 336/225–232; 257/531, E27.046

(56) References Cited

U.S. PATENT DOCUMENTS

| | | |
|---|---|---|
| 5,610,433 A | 3/1997 | Merrill et al. |
| 6,380,835 B1 | 4/2002 | Lee |

FOREIGN PATENT DOCUMENTS

| | | |
|---|---|---|
| KR | 1998-020010 | 6/1998 |
| KR | 2001-0011350 | 2/2001 |

OTHER PUBLICATIONS

Craninckx et al., "A 1.8–GHz Low–Phase–Noise CMOS VCO Using Optimized Hollow Spiral Inductors," *IEEE Journal of Solid–State Circuits*, vol. 32, No. 5, May 1997, pp. 736–744.

Ham et al., "Concepts and Methods in Optimization of Integrated LC VCOs," *IEEE Journal of Solid–State Circuits*, vol. 36, No. 6, Jun. 2001, pp. 896–909.

Tiebout, "Low–Power Low–Phase–Noise differentially Tuned Quadrature VCO Design in Standard CMOS," *IEEE Journal of Solid–State Circuits*, vol. 36, No. 7, Jul. 2001, pp. 1018–1024.

*Primary Examiner*—James R. Scott
(74) *Attorney, Agent, or Firm*—Foley & Lardner LLP

(57) ABSTRACT

Electrically conductive layers 1a and 2a connected to each other via a contact form one inductor, while electrically conductive layers 1b and 2b connected to each other via other contact form the other inductor. Since the areas defined by the loops forming these two inductors are equal to each other, the inductances of the inductors are also equal to each other. Between both the inductors, the lengths in the loop of the portions (the conductive layers 1a and 1b) formed on a lower interlayer insulating film are equal to each other, while the lengths in the loop of the portions (the conductive layers 2a and 2b) formed on an upper interlayer insulating film are also equal to each other. This allows external disturbances such as parasitic capacitance to affect both the inductors equally. Accordingly, a voltage controlled oscillator incorporating the invention can stably provide undistorted sinusoidal oscillation signals.

9 Claims, 7 Drawing Sheets

SEMICONDUCTOR INTEGRATED CIRCUIT

BACKGROUND OF THE INVENTION

1. Field of the Invention

The present invention relates to semiconductor integrated circuits suitable for use in voltage controlled oscillators and more particularly to a semiconductor integrated circuit that can deliver stable oscillation frequencies while providing for a reduced area occupied by inductors.

2. Description of the Related Art

Conventionally, a voltage controlled oscillator (VCO) has been available that is built in high-frequency semiconductor devices or the like. FIG. 1 is a circuit diagram illustrating a prior art voltage controlled oscillator.

In the prior art voltage controlled oscillator, the drains of transistors Tr1 and Tr2 are connected to a constant current power supply S1. Inductors L1 and L2 are each connected at one end thereof to a power supply line through which a power supply voltage VDD is provided. The inductance of the inductor L1 is equal to that of the inductor L2. On the other hand, the inductor L1 is connected at the other end thereof with a varactor diode D1, the source of the transistor Tr1, and the gate of the transistor Tr2, while the inductor L2 is connected at the other end thereof with a varactor diode D2, the source of the transistor Tr2, and the gate of the transistor Tr1. An analog control voltage is applied to the varactor diodes D1 and D2.

In the prior art voltage controlled oscillator constructed as described above, it is possible to acquire an oscillation signal from the source of the transistor Tr1. However, to acquire an undistorted sinusoidal oscillation signal, the properties of the inductors L1 and L2 need to match with each other. FIG. 2 is a schematic view illustrating an exemplary structure of the inductors L1 and L2.

For example, the inductors L1 and L2 of the prior art voltage controlled oscillator comprise a circular electrically conductive layer formed on an interlayer insulating film. With this arrangement, the conductive layers need to be symmetric in a plan view with respect to a straight line passing through their midpoint position in order to allow their properties to match with each other as described above. For example, inductors configured as such are described in articles such as "A 1.8-Ghz Low-Phase-Noise CMOS VCO Using Optimized Hollow Spiral Inductors," IEEE JOURNAL OF SOLID-STATE CIRCUIT, VOL.32, NO.5, MAY 1997, or "Concepts and Methods in Optimization of Integrated LC VCOs," IEEE JOURNAL OF SOLID-STATE CIRCUIT, VOL.36, NO.6, JUNE 2001.

On the other hand, to obtain oscillation frequencies on the order of a few hundred MHz to 10 GHz, the inductors L1 and L2 need to have an inductance on the order of 0.1 nH to a few nH. To obtain an inductance of this order, the inductors L1 and L2 need to have a diameter on the order of a few tens to a few hundreds of $\mu$m. Providing inductors of such high an inductance would cause not only their chip areas to increase but also make the inductors susceptible to disturbances such as external noise, thereby resulting in a property mismatch between both the inductors. That is, a circuit formed in the vicinity having an influence on the property of one inductor would mismatch with the other circuit formed in the vicinity having an influence on the property of the other inductor, thereby making the properties difficult to match with each other. The presence of the property mismatch makes it difficult to provide undistorted sinusoidal waves.

In this context, such an arrangement in which a double loop is formed and a half of the inner and outer loop is used to provide two inductors is disclosed in "Low-Power Low-Phase-Noise Differentially Tuned Quadrature VCO Design in Standard CMOS," IEEE JOURNAL OF SOLID-STATE CIRCUIT, VOL.36, NO.7, JULY 2001. FIG. 3 is a layout diagram illustrating a prior art inductor pair that employs a double loop.

In the aforementioned article, as shown in FIG. 3, such an arrangement is described in which one semicircular portion acts as an outer path and the other semicircular portion acts as an inner path, thereby forming two inductors. According to such an arrangement, the area occupied by the inductors is halved, thereby making it possible to reduce chip areas and influences such as external noise.

However, concerning the arrangement shown in FIG. 3, the aforementioned article has made no mention of the three dimensional structure of the intersections of the inductors. It is possible to implement the arrangement shown in FIG. 3 by providing part of one inductor in an underlying wiring layer; however, such a structure may result in a property mismatch between the two inductors.

As shown in FIG. 4, an odd number of total windings of the two inductors may not cause a property mismatch between the two inductors; however, an even number of total windings inevitably results in a property mismatch. Although not illustrated in FIG. 4, the use of this arrangement requires a power supply line for supplying a power supply voltage to the inductors.

SUMMARY OF THE INVENTION

It is therefore an object of the present invention to provide a semiconductor integrated circuit that can deliver stable oscillation frequencies when employed for voltage controlled oscillators while providing for a reduced area occupied by inductors.

A semiconductor integrated circuit according to the present invention includes two power supply lines held at different electric potentials; and two inductors connected in parallel to each other between the two power supply lines and having the same inductance, the two inductors having an even number of total windings. The semiconductor integrated circuit is characterized in that the two inductors have at least two electrically conductive layers each formed on an interlayer insulating film; and ratios of a length of an electrically conductive layer formed on one interlayer insulating film and on the other interlayer insulating film to a total length of the electrically conductive layers constituting the inductors are equal to each other between the two inductors.

The present invention employs the inductors formed of at least two electrically conductive layers, thereby providing a further reduced area occupied by the inductors when compared with inductors formed of only one conductive layer. Furthermore, since the contents of the electrically conductive layers in the two inductors are equal to each other, both the inductors are equally subjected to external disturbances such as parasitic capacitance. This makes the inductors impervious to a property mismatch therebetween and allows for providing stable oscillation frequencies. The inductors need not always be connected directly to two power supply lines, and a transistor or the like may be provided between the inductors and the power supply lines.

The two inductors can have two electrically conductive layers, and the ratio of a length of a lower electrically conductive layer and the ratio of a length of an upper electrically conductive layer to the total length of an electrically conductive layer constituting each conductor can be made equal to each other. This makes it possible to reduce the area occupied by the inductors to half the area occupied by inductors formed of only one layer.

Furthermore, one of the two inductors may be provided with two first upper electrically conductive layers formed on the same interlayer insulating film and having both end portions spaced apart from each other, and a first lower electrically conductive layer underlying the first upper electrically conductive layers and having an end portion overlapping with the end portion of the two first upper electrically conductive layers in a plan view. The other of the two inductors may also be provided with two second upper electrically conductive layers formed on the same interlayer insulating film as the first upper electrically conductive layers, being the same in total length as the first upper electrically conductive layer, and having both end portions spaced apart from each other; and a second lower electrically conductive layer underlying the second upper electrically conductive layers and having an end portion overlapping with the end portion of the two second upper electrically conductive layers in a plan view. Thus, the two inductors are configured to intersect each other in a plan view. This makes it possible to increase the content of the first and second upper electrically conductive layers in each inductor, and provide higher Q values with increasing contents of an electrically conductive layer spaced apart from the semiconductor substrate.

At least parts of the two inductors preferably overlap each other in a plan view. More preferably, the two inductors are circular in a plan view, and the centers of the circles are aligned with each other. The two inductors can also be polygonal in a plan view.

Furthermore, the at least two electrically conductive layers can be connected to each other via a contact. In this case, the electrically conductive layers can be made wider at a region where the contact is provided than at other portions, thereby preventing an increase in electrical resistance caused by the contact provided.

Still furthermore, the two inductors can be connected to a varactor diode in a voltage controlled oscillator.

DETAILED DESCRIPTION OF THE PREFERRED EMBODIMENT

Figure 1:
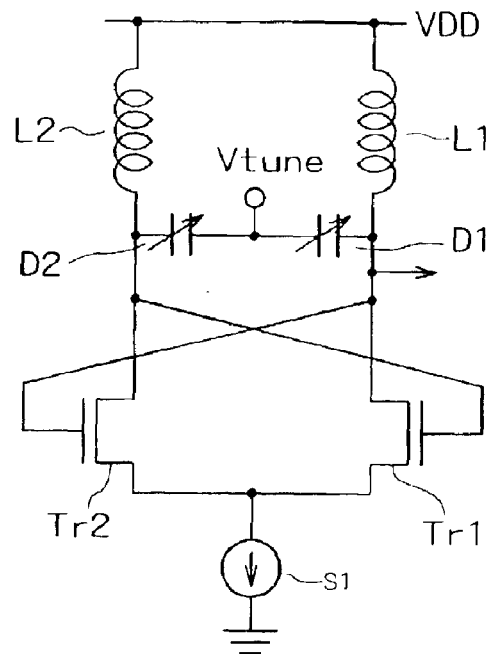
FIG. 1 is a circuit diagram showing a prior art voltage controlled oscillator.
Figure 2:
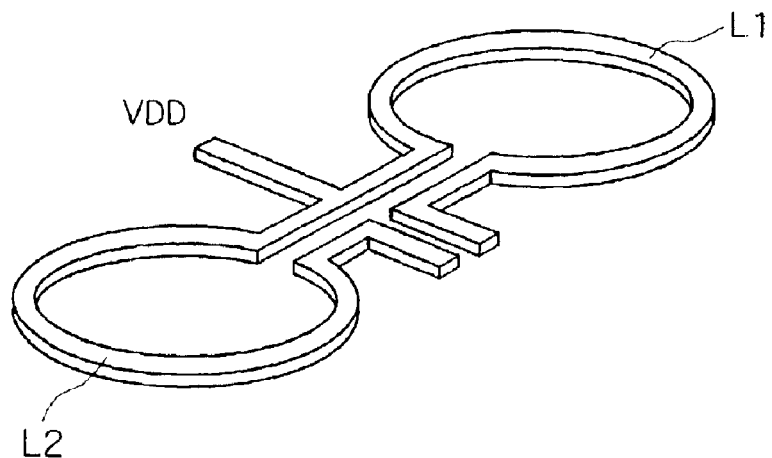
FIG. 2 is a schematic view illustrating an exemplary structure of inductors L1 and L2.
Figure 3:
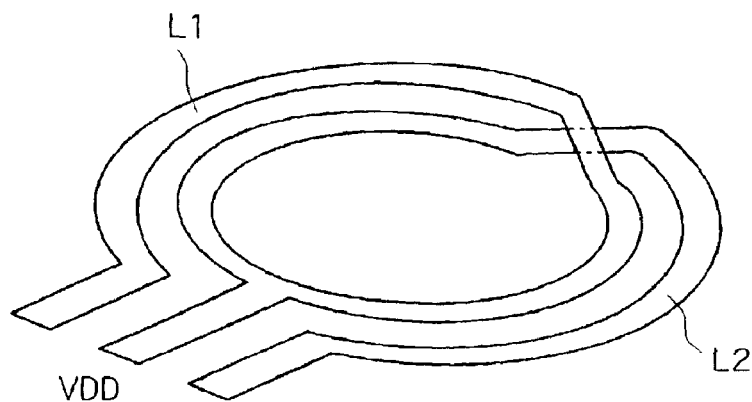
FIG. 3 is a layout diagram illustrating a prior art inductor pair that employs a double loop.
Figure 4:
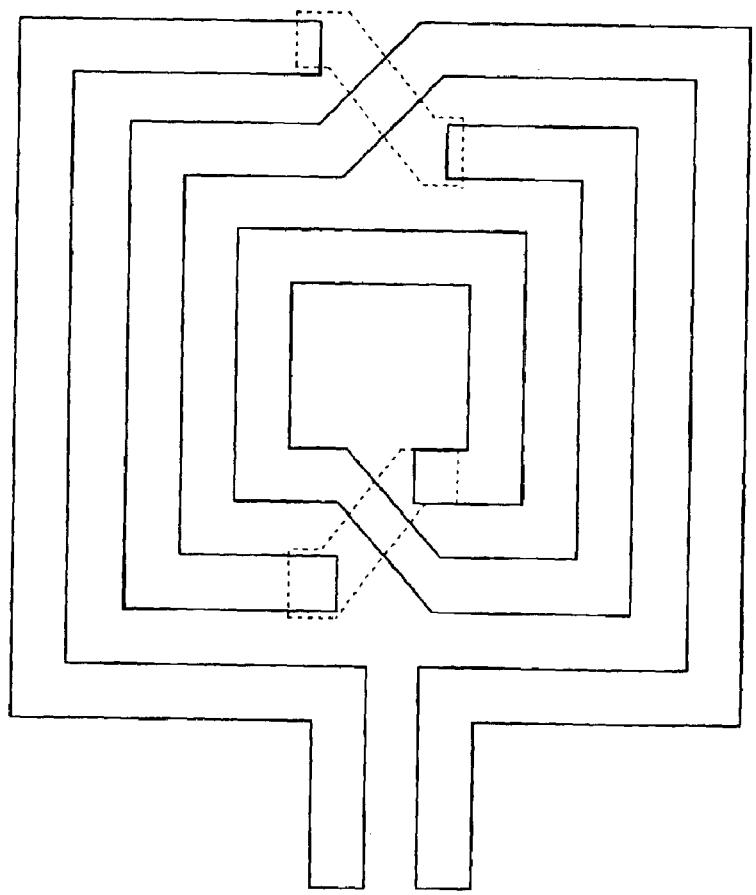
FIG. 4 is a layout diagram illustrating an exemplary prior art inductor having an odd number of total windings.
Figure 5:
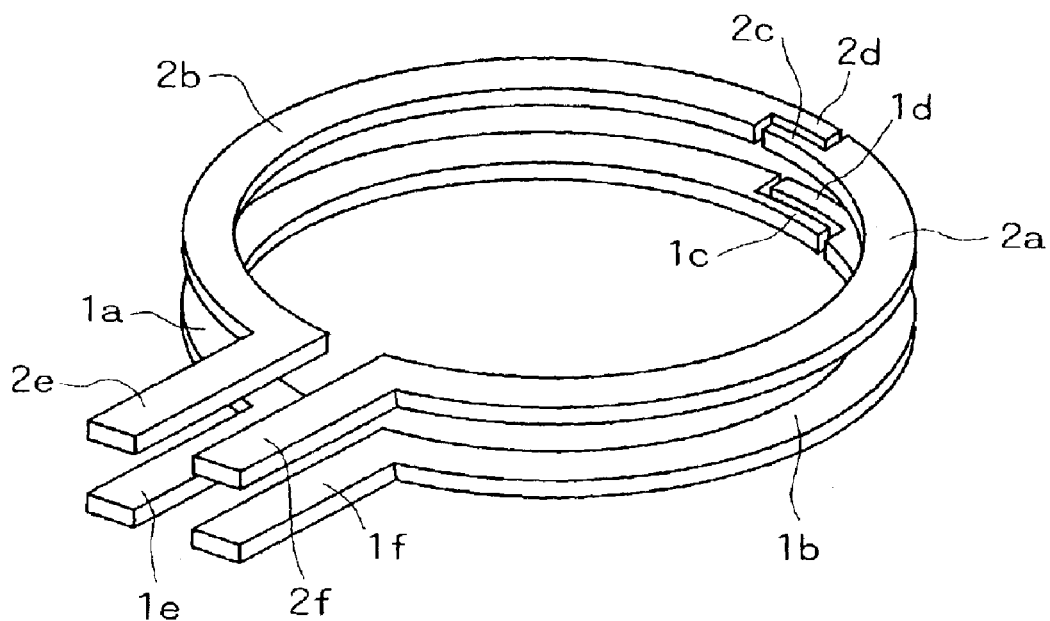
FIG. 5 is a schematic view illustrating a semiconductor integrated circuit according to a first embodiment of the present invention.

Now, the present invention will be described below more specifically with reference to the accompanying drawings in accordance with the embodiments. FIG. 5 is a schematic view illustrating a semiconductor integrated circuit according to a first embodiment of the present invention.

Figure 6:
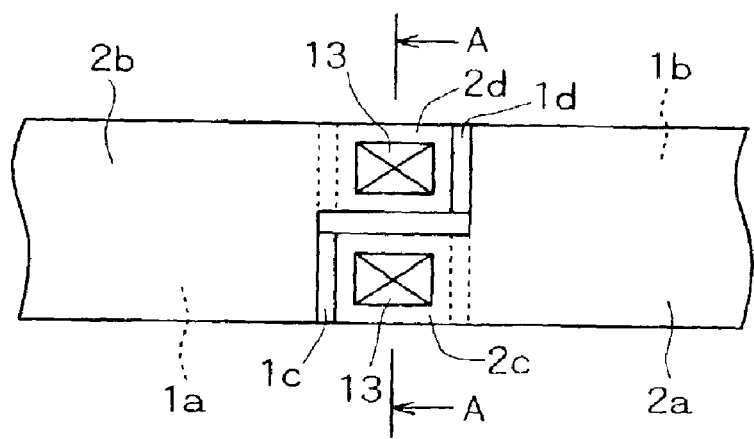
FIG. 6 is a schematic view illustrating a connection between inductors according to the first embodiment.

FIG. 6 is a schematic view illustrating a connection between inductors according to the first embodiment.

Figure 7:
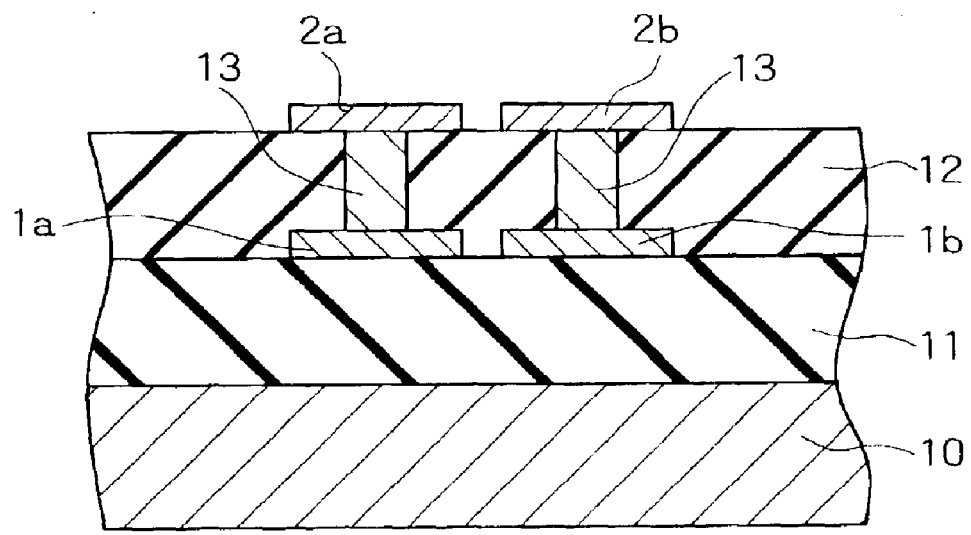
FIG. 7 is a cross-sectional view taken along the line A—A of FIG. 6.

FIG. 7 is a cross-sectional view taken along the line A—A of FIG. 6.

In the first embodiment, there are formed an interlayer insulating film 11 on a semiconductor substrate 10, and semicircular electrically conductive layers 1a and 1b on the interlayer insulating film 11. For example, the conductive layers 1a and 1b are formed so as to form part of the same circle. In other words, the center of one circle having the conductive layer 1a as a semicircle is aligned with the center of the other circle having the conductive layer 1b as a semicircle, with these circles being equal to each other in radius. For example, the conductive layers 1a and 1b have a width of a few nm to a few tens of nm, and the circles having these layers as a semicircle have, but not limited to, a radius of the order of a few tens of $\mu$m to 200 $\mu$m.

An interlayer insulating film 12 is formed on the interlayer insulating film 11 so as to cover the conductive layers 1a and 1b. For example, the interlayer insulating film 12 has, but not limited to, a thickness of 0.5 $\mu$m to almost 1 $\mu$m. There are also formed semicircular electrically conductive layers 2a and 2b on the interlayer insulating film 12. The conductive layer 2a is formed so as to overlap in a plan view with the conductive layer 1b, while the conductive layer 2b is formed so as to overlap in a plan view with the conductive layer 1a. Accordingly, in any case, the centers of the circle having the conductive layer 2a as a semicircle and the circle of the conductive layer 2b as a semicircle are aligned in a plan view with the centers of the circle having the conductive layer 1a as a semicircle and the circle having the conductive layer 1b as a semicircle. Additionally, all of these circles have the same radius. For example, the conductive layers 2a and 2b have a width of a few nm to a few tens of nm, and the circles having these layers as a semicircle have, but not limited to, a radius of the order of a few tens of $\mu$m to 200 $\mu$m. For example, each of the conductive layers is formed of an electrically conductive material such as AlCu.

One end portions 1c and 1d of the conductive layers 1a and 1b, disposed to face to each other, have almost a half the width of the rest of the conductive layers 1a and 1b to be mated interdigitally with each other. Likewise, one end portions 2c and 2d of the conductive layers 2a and 2b, located above the reduced-width end portions of the conductive layers 1a and 1b, have almost a half the width of the rest of the conductive layers 2a and 2b and are mated interdigitally with each other. As shown in FIGS. 6 and 7, in a plan view, the end portion 2c of the conductive layer 2a is disposed to overlap with the end portion 1c of the conductive layer 1a, while the end portion 2d of the conductive layer 2b is disposed to overlap with the end portion 1d of the conductive layer 1b. There are formed contact holes in the interlayer insulating film 12 between the end portion 2c of the conductive layer 2a and the end portion 1c of the conductive layer 1a and between the end portion 2d of the conductive layer 2b and the end portion 1d of the conductive layer 1b, respectively, and a contact 13 (not shown in FIG. 5) is buried in each of the contact holes. For example, the contact 13 is formed of an electrically conductive material, such as Cu, having a low electric resistance.

For example, the conductive layers 2a and 2b are connected together at their other ends 2e and 2f to a power supply line, while the conductive layers 1a and 1b are connected together at their other ends 1e and 1f to varactor diodes, respectively, or to a ground line via a transistor or the like.

In the first embodiment configured in this manner, the conductive layers 1a and 2a connected to each other via their contact 13 form one inductor, while the conductive layers 1b and 2b connected to each other via their contact 13 form the other inductor. Additionally, for example, these inductors are connected in parallel to each other between a power supply line and a ground line. Since the areas defined by the loops forming these two inductors are equal to each other, the inductances of the inductors are also equal to each other. Furthermore, between both the inductors, the lengths in the loop of the portions (the conductive layers 1a and 1b) formed on the interlayer insulating film 11 are equal to each other, while the lengths in the loop of the portions (the conductive layers 2a and 2b) formed on the interlayer insulating film 12 are also equal to each other. This allows external disturbances such as parasitic capacitance to affect both the inductors equally. For this reason, a voltage controlled oscillator to which the first embodiment is applied makes it possible to stably provide undistorted sinusoidal oscillation signals.

In the first embodiment described above, the presence of the contacts 13 in the inductors causes the whole resistance to be greater than that of the prior art. However, it is possible to lower the increase in the whole resistance by making the width of the two conductive layers greater than that of the rest thereof and providing a plurality of contacts within the width at the connection between the two conductive layers.

Figure 8:
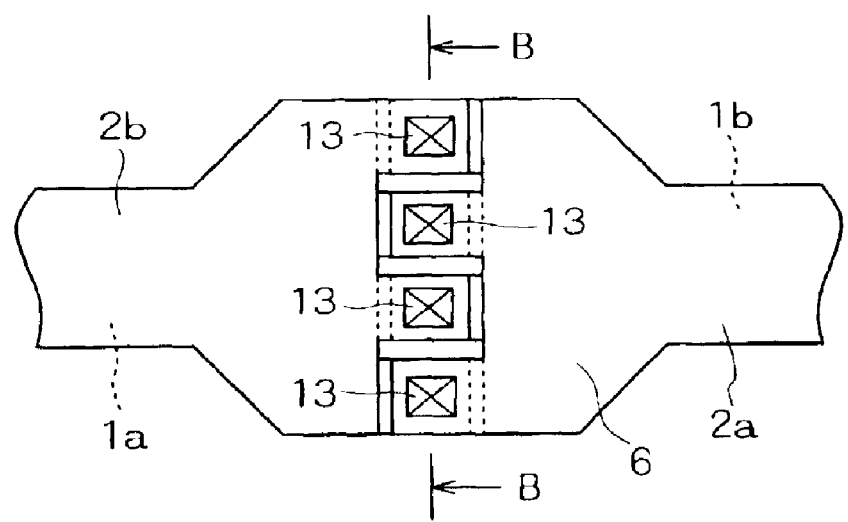
FIG. 8 is a schematic view illustrating a connection according to a modified example of the first embodiment.
Figure 9:
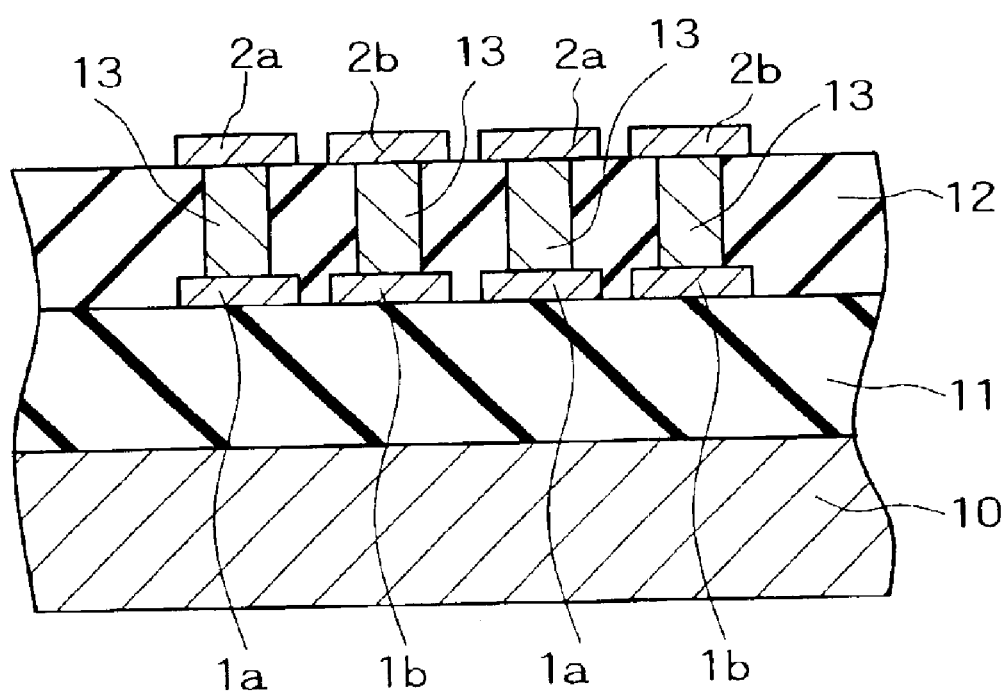
FIG. 9 is a cross-sectional view taken along the line B—B of FIG. 8.

FIG. 8 is a schematic view illustrating a connection according to a modified example of the first embodiment, and FIG. 9 is a cross-sectional view taken along the line B—B of FIG. 8.

In this modified example, the width of the conductive layers 1a, 1b, 2a, and 2b at a connection 6 is about twice the width of the rest thereof. Additionally, the conductive layer 1a and the conductive layer 2a are connected to each other via two contacts 13, while the conductive layer 1b and the conductive layer 2b are connected to each other via two other contacts 13.

When compared with the first embodiment shown in FIGS. 5 to 7, this modified example provides a reduced resistance at the connection 6.

Now, the present invention will be explained below with reference to a second embodiment.

Figure 10:
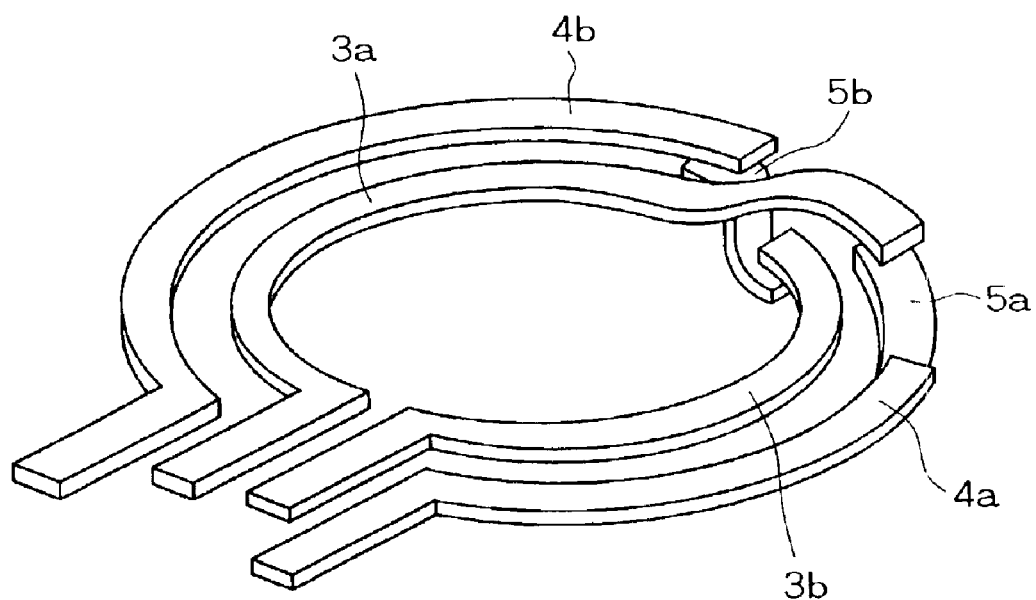
FIG. 10 is a schematic view illustrating a semiconductor integrated circuit according to a second embodiment of the present invention.
Figure 11:
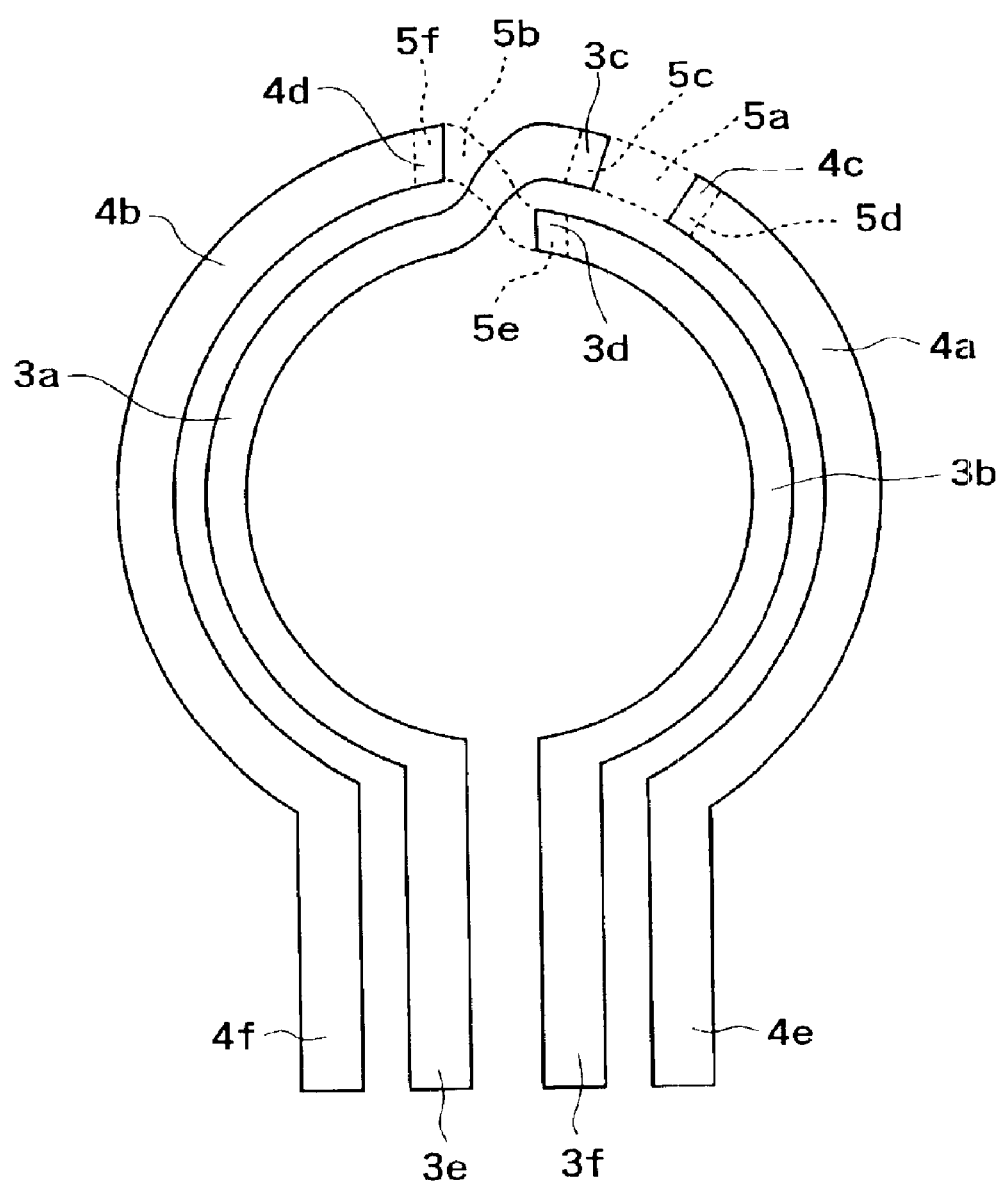
FIG. 11 is a plan view illustrating the semiconductor integrated circuit according to the second embodiment of the present invention.

FIGS. 10 and 11 are a schematic view and a plan view illustrating a semiconductor integrated circuit according to the second embodiment of the present invention, respectively.

In the second embodiment, first and second interlayer insulating films (not shown) are successively deposited on a semiconductor substrate (not shown), and then a semicircular conductive layers 3a and 3b are formed thereon. For example, the conductive layers 3a and 3b are formed so as to constitute part of the same circle. In other words, the center of one circle having the conductive layer 3a as a semicircle is aligned with the center of the other circle having the conductive layer 3b as a semicircle, and these circles are equal to each other in radius. For example, the conductive layers 3a and 3b have a width of a few nm to a few tens of nm, and the circles having these layers as a semicircle have, but not limited to, a radius of the order of a few tens of $\mu$m to 200 $\mu$m.

There are also formed semicircular electrically conductive layers 4a and 4b outside the conductive layers 3a and 3b. The conductive layer 4a is located outside the conductive layer 3b, while the conductive layer 4b is located outside the conductive layer 3a. In any case, the center of the circle having the conductive layer 4a as a semicircle and the circle having the conductive layer 4b as a semicircle is aligned in a plan view with the center of the circle having the conductive layer 3a as a semicircle and the circle having the conductive layer 3b as a semicircle. For example, the conductive layers 4a and 4b have, but not limited to, a width of a few nm to a few tens of nm. Additionally, the conductive layers 4a, 4b and the conductive layers 3a, 3b are preferably spaced as close to each other as possible.

More specifically, in this embodiment, the length of the conductive layers 3b, 4a, and 4b is a little shorter than that of a perfect semicircle, with the conductive layer 4a being less than the conductive layer 4b in length. On the other hand, an end portion of the conductive layer 3a weaves between the end portions of the conductive layers 3b and 4b to where the distance between the end portions of the conductive layers 3a and 4a is equal to that between the end portions of the conductive layers 3b and 4b.

In this embodiment, on the first interlayer insulating film, an electrically conductive layer 5a is also formed such that its ends are each located under the conductive layers 3a and 4a, while an electrically conductive layer 5b is formed such that its ends are each located under the conductive layers 3b and 4b. The lengths of the conductive layers 5a and 5b are generally equal to each other. In the second interlayer insulating film, there are formed contact holes between the end portion 3c of the conductive layer 3a and the end portion 5c of the conductive layer 5a, between the end portion 4c of the conductive layer 4a and the end portion 5d of the conductive layer 5a, between the end portion 3d of the conductive layer 3b and the end portion 5e of the conductive layer 5b, and between the end portion 4d of the conductive layer 4b and the end portion 5f of the conductive layer 5b. In each of the contact holes, a contact (not shown) is buried.

For example, the conductive layers 4a and 4b are connected together at their other ends 4e and 4f to a power supply line, while the conductive layers 3a and 3b are connected together at their other ends 3e and 3f to varactor diodes or transistors, respectively.

In the second embodiment configured in this manner, the conductive layers 3a and 4a connected to each other via their contacts form one inductor, while the conductive layers 3b and 4b connected to each other via their contacts form the other inductor. Additionally, as in the first embodiment, since the areas defined by the loops forming these two inductors are equal to each other, the inductances of the inductors are also equal to each other. Furthermore, between both the inductors, the lengths in the loop of the portions (the conductive layers 5a and 5b) formed on the first interlayer insulating film are equal to each other, while the lengths in the loop of the portions (the conductive layers 3a, 4a and the conductive layers 3b, 4b) formed on the second interlayer insulating film are also equal to each other. This allows external disturbances such as parasitic capacitance to affect both the inductors equally. For this reason, the same effect as that of the first embodiment is obtained.

The inductors are formed in the two layers in the first embodiment, whereas the inductors are constructed by forming a double loop in a single layer in the second embodiment; however, the present invention is not limited thereto. The inductors may also be formed in three or more layers, or constructed by forming triple or more loops, or constructed in a combination thereof. When the same inductance is obtained, a larger number of layers provide a further reduced area occupied by the inductors.

In the first embodiment, the upper conductive layer is aligned with the lower conductive layer in a plan view; however, an alignment mismatch between the two layers may also be allowable as long as the alignment mismatch is the same between the two inductors.

Furthermore, the plan view of the inductors is not limited to a circular shape but may be a rectangular shape, an octagonal shape or the like. In these cases, the centers of gravity of the two inductors are preferably aligned with each other.

As detailed in the foregoing, the present invention employs the inductors formed of at least two electrically conductive layers, thereby making it possible to provide a further reduced area occupied by the inductors when compared with inductors formed of only one conductive layer. Furthermore, since the contents of the electrically conductive layers in the two inductors are equal to each other, both the inductors are equally subjected to external disturbances such as parasitic capacitance and thereby made impervious to property discrepancies. As a result, it is possible to provide stable oscillation frequencies.

What is claimed is:

1. A semiconductor integrated circuit comprising
   two power supply lines held at different electric potentials, and
   two inductors connected in parallel to each other between said two power supply lines and having the same inductance, said two inductors having an even number of total windings,
   wherein said two inductors have at least two electrically conductive layers each formed on an interlayer insulating film, and
   ratios of a length of an electrically conductive layer formed on one interlayer insulating film and on the other interlayer insulating film to a total length of the electrically conductive layers constituting said inductors are equal to each other between said two inductors.

2. The semiconductor integrated circuit according to claim 1, wherein
   said two inductors have two electrically conductive layers, and
   a ratio of a length of a lower electrically conductive layer and a ratio of a length of an upper electrically conductive layer to a total length of an electrically conductive layer constituting each conductor are equal to each other.

3. The semiconductor integrated circuit according to claim 1, wherein
   one of said two inductors comprises
   two first upper electrically conductive layers formed on the same interlayer insulating film and having both end portions spaced apart from each other, and
   a first lower electrically conductive layer underlying the first upper electrically conductive layers and having an end portion overlapping with the end portion of said two first upper electrically conductive layers in a plan view,
   the other of said two inductors comprises
   two second upper electrically conductive layers formed on the same interlayer insulating film as said first upper electrically conductive layers, being the same in total length as said first upper electrically conductive layer, and having both end portions spaced apart from each other, and
   a second lower electrically conductive layer underlying the second upper electrically conductive layers and having an end portion overlapping with the end portion of said two second upper electrically conductive layers in a plan view, and
   said two inductors intersect each other in a plan view.

4. The semiconductor integrated circuit according to claim 1, wherein
   at least parts of said two inductors overlap each other in a plan view.

5. The semiconductor integrated circuit according to claim 4, wherein
   said two inductors are circular in a plan view, and centers of the circles are aligned with each other.

6. The semiconductor integrated circuit according to claim 4, wherein
   said two inductors are polygonal in a plan view.

7. The semiconductor integrated circuit according to claim 1, wherein
   said at least two electrically conductive layers are connected to each other via a contact.

8. The semiconductor integrated circuit according to claim 7, wherein
   said electrically conductive layers are wider at a region where said contact is provided than at other portions.

9. The semiconductor integrated circuit according to claim 1, wherein
   said two inductors are connected to a varactor diode of a voltage controlled oscillator.

* * * * *